(12) United States Patent
Zhao et al.

(10) Patent No.: US 12,178,002 B2
(45) Date of Patent: Dec. 24, 2024

(54) HEAT DISSIPATION DEVICE AND SERVER

(71) Applicant: Fulian Precision Electronics (Tianjin) Co., LTD., Tianjin (CN)

(72) Inventors: Ya-Ting Zhao, Tianjin (CN); Yan Yuan, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 218 days.

(21) Appl. No.: 17/989,531

(22) Filed: Nov. 17, 2022

(65) Prior Publication Data
US 2023/0389223 A1 Nov. 30, 2023

(30) Foreign Application Priority Data
May 30, 2022 (CN) .......................... 202221331247.8

(51) Int. Cl.
*H05K 7/20* (2006.01)
(52) U.S. Cl.
CPC ..... *H05K 7/20154* (2013.01); *H05K 7/20727* (2013.01)
(58) Field of Classification Search
CPC combination set(s) only.
See application file for complete search history.

(56) References Cited

U.S. PATENT DOCUMENTS

| | | | | |
|---|---|---|---|---|
| 7,613,001 B1 * | 11/2009 | Liu | .................... | H05K 7/20336 361/679.52 |
| 8,291,964 B2 * | 10/2012 | Hwang | ............... | H01L 23/3672 165/185 |
| 2008/0128118 A1 * | 6/2008 | Chen | .................... | H01L 23/4006 165/104.33 |
| 2009/0279251 A1 * | 11/2009 | Liu | .................... | H05K 7/20336 165/80.3 |
| 2010/0139892 A1 * | 6/2010 | Lian | .................... | H01L 23/3672 165/104.26 |
| 2011/0110035 A1 * | 5/2011 | Cheng | .................... | H01L 23/467 361/702 |
| 2023/0240046 A1 * | 7/2023 | Sasabe | ............... | H05K 7/20727 361/697 |
| 2023/0389223 A1 * | 11/2023 | Zhao | .................. | H05K 7/20727 |
| 2023/0397372 A1 * | 12/2023 | Yarragunta | ........ | H05K 7/20727 |
| 2024/0090174 A1 * | 3/2024 | Huang | ............... | H05K 7/20727 |

* cited by examiner

Primary Examiner — Lisa Lea-Edmonds
(74) Attorney, Agent, or Firm — ScienBiziP, P.C.

(57) ABSTRACT

A heat dissipation device includes a housing with an air passage and air inlet and air outlet. The heat dissipation structures are in the air passage and include a first heat dissipation structure adjacent to the air inlet and a second heat dissipation structure adjacent to the air outlet. A projection of the first heat dissipation structure in the second heat dissipation structure along the first direction is within the second heat dissipation structure. The first and second heat dissipation structures each include a thermally conductive plate and gapped fins thereon disposed. A spacing of each gap in the first heat dissipation structure is greater than a spacing of each gap in the second heat dissipation structure.

20 Claims, 10 Drawing Sheets

HEAT DISSIPATION DEVICE AND SERVER

FIELD

The subject matter herein generally relates to heat dissipation, more particularly to a heat dissipation device and a server equipped with the heat dissipation device.

BACKGROUND

A server is used to provide computing or application services for clients (such as PCs, smartphones, and other terminals). The server is equipped with a plurality of chips which generate a lot of heat when working, the chips need to be cooled by heat sinks. Existing heat sinks have roughly the same size. Along a direction of flow of cold air, heat sinks located in the front have a high resistance to cold air, which decreases the flow of cold air entering heat sinks located at the rear. This results in insufficient heat dissipation performance of the heat sinks at the rear of the server and affects overall heat dissipation.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure.

It should be noted that, when a first component is referred to as "installed" on a second component, it is intended that the first component may be directly installed on the second component or may be indirectly installed on the second component via a third component between them. When a first component is referred to as "disposed on" a second component, it is intended that the first component may be directly disposed on the second component or may be indirectly disposed via a third component between them.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments. The term "and/or" used herein includes any suitable combination of one or more related items listed. The terms "vertical", "horizontal", "left", "right", "top", "bottom" and similar expressions used herein are for illustration purposes only and are not intended to limit the application.

It can be understood that when two components are described to be parallel or vertical, an included angle between the two components can have a tolerance of ±10% relative to the standard included angle when they are parallel or vertical.

Figure 1:
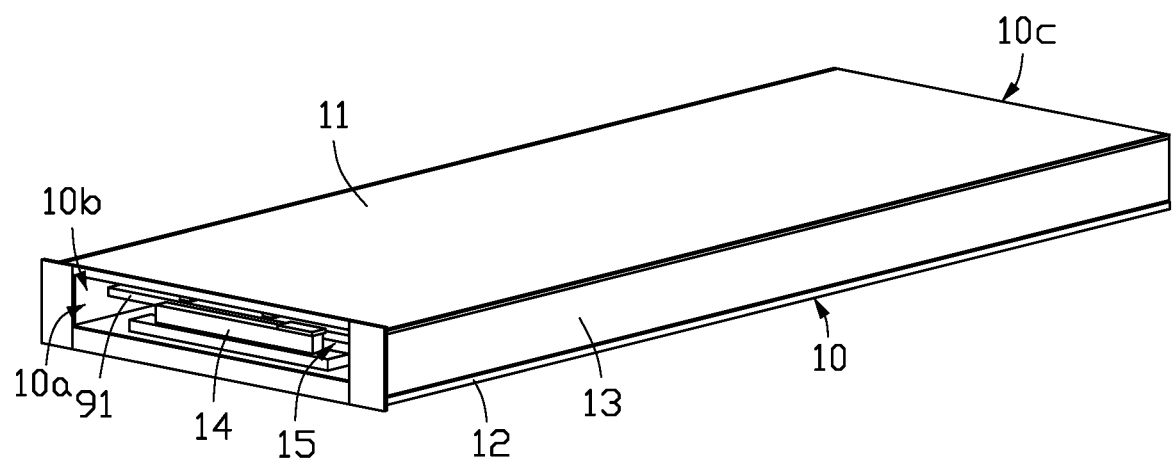
FIG. 1 is a schematic view of a heat dissipation device according to one embodiment.
Figure 1:
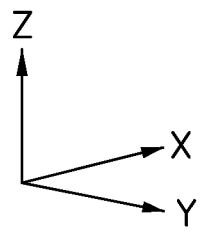
Figure 2:
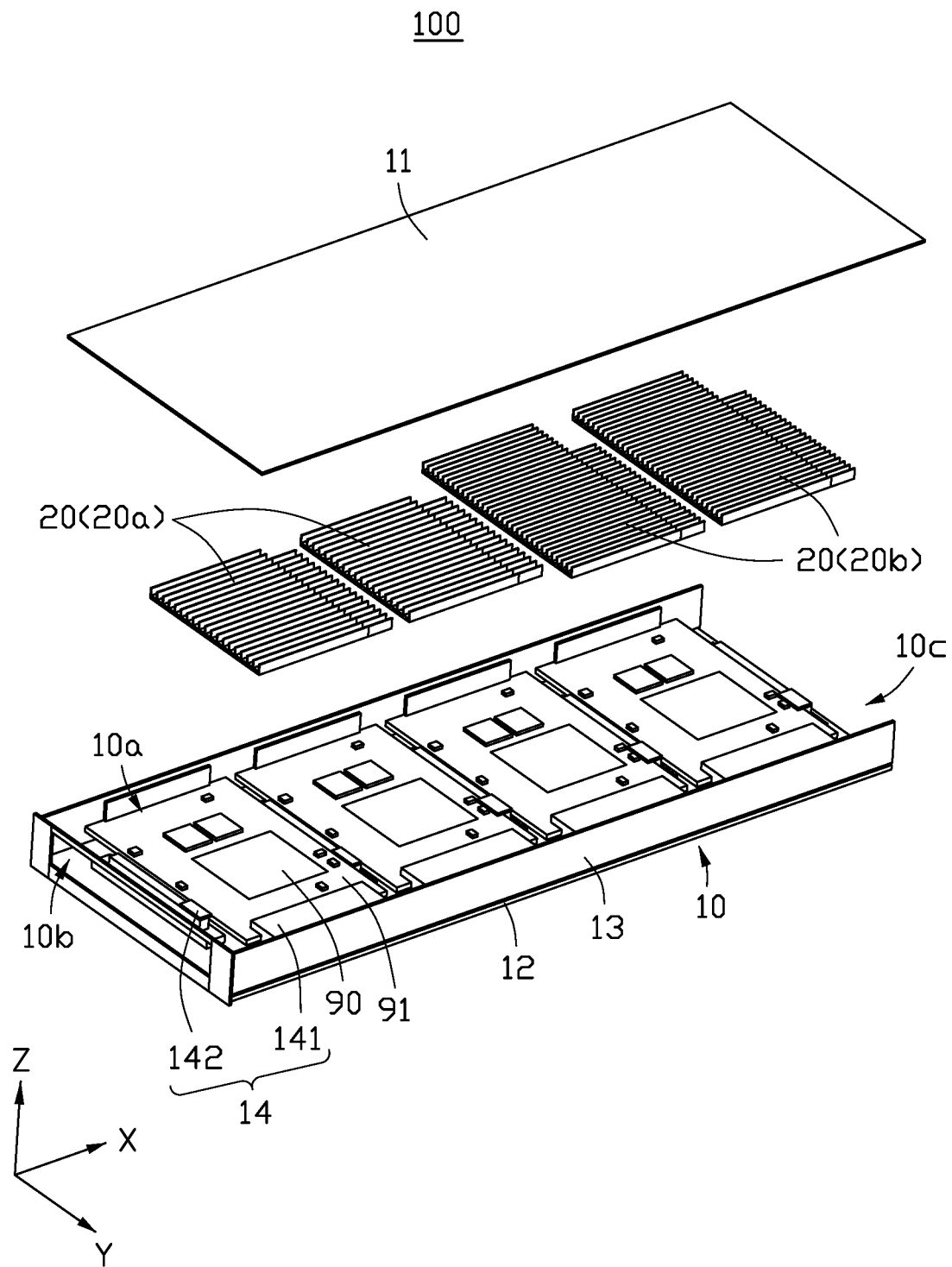
FIG. 2 is an exploded view of the heat dissipation device of FIG. 1.

Referring to FIGS. 1 and 2, a heat dissipation device 100 of an embodiment is illustrated. The heat dissipation device 100 is applied to a component 90. The component 90 may be, but is not limited to, a chip. The heat dissipation device 100 includes a housing 10 and a plurality of heat dissipation structures 20.

The housing 10 defines an air passage 10a extending along a first direction X, an air inlet 10b, and an air outlet 10c disposed at both ends of the air passage 10a. Cold air is introduced into the air passage 10a via the air inlet 10b, flows to the air outlet 10c along the first direction X, then flows out of the housing 10 via the air outlet 10c. The air passage 10a contains the component 90, so that the cold air flows over or through the component 90 and cools it.

Figure 3:
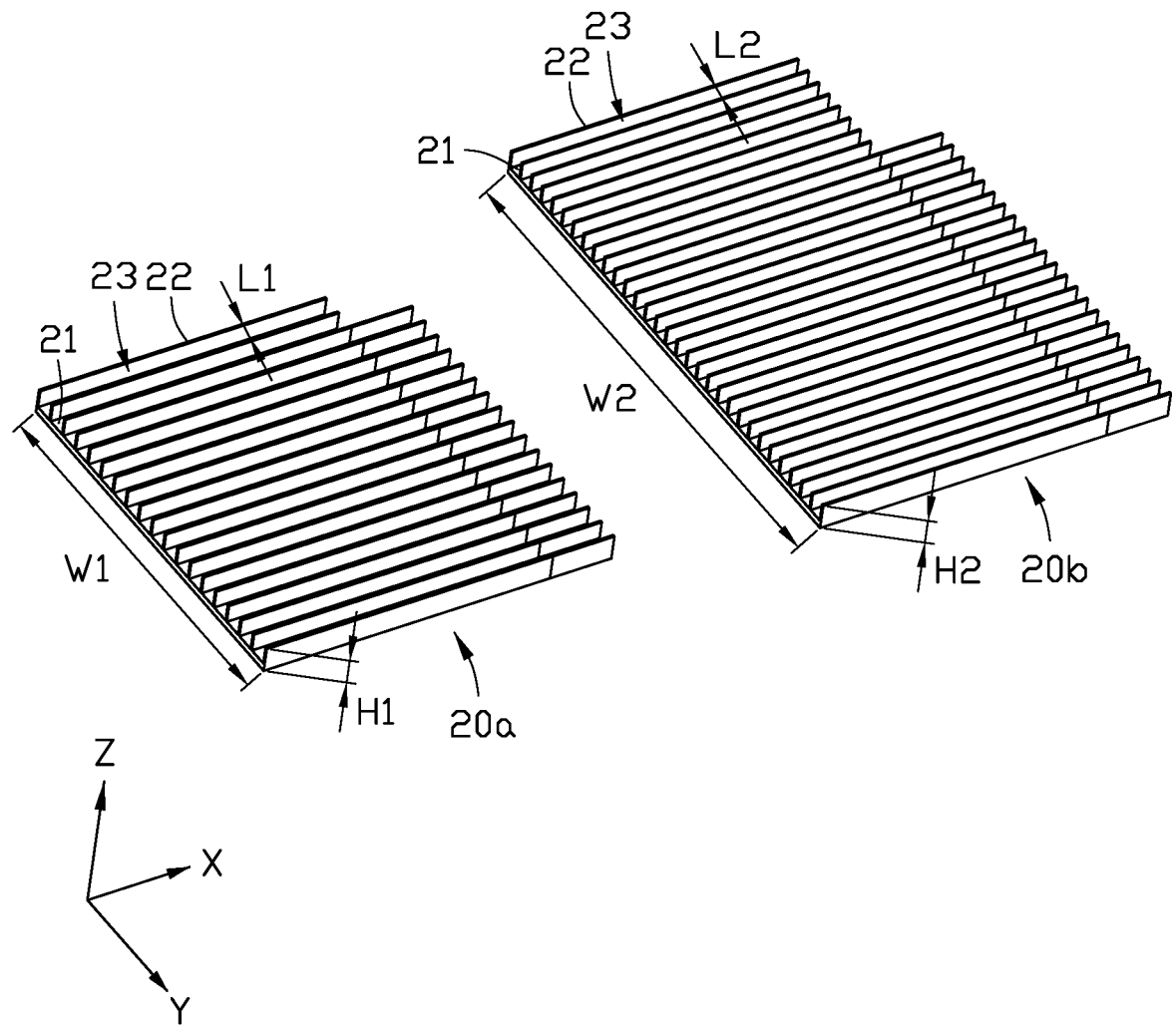
FIG. 3 is a perspective view of a first heat dissipation structure and a second heat dissipation structure according to one embodiment.
Figure 5:
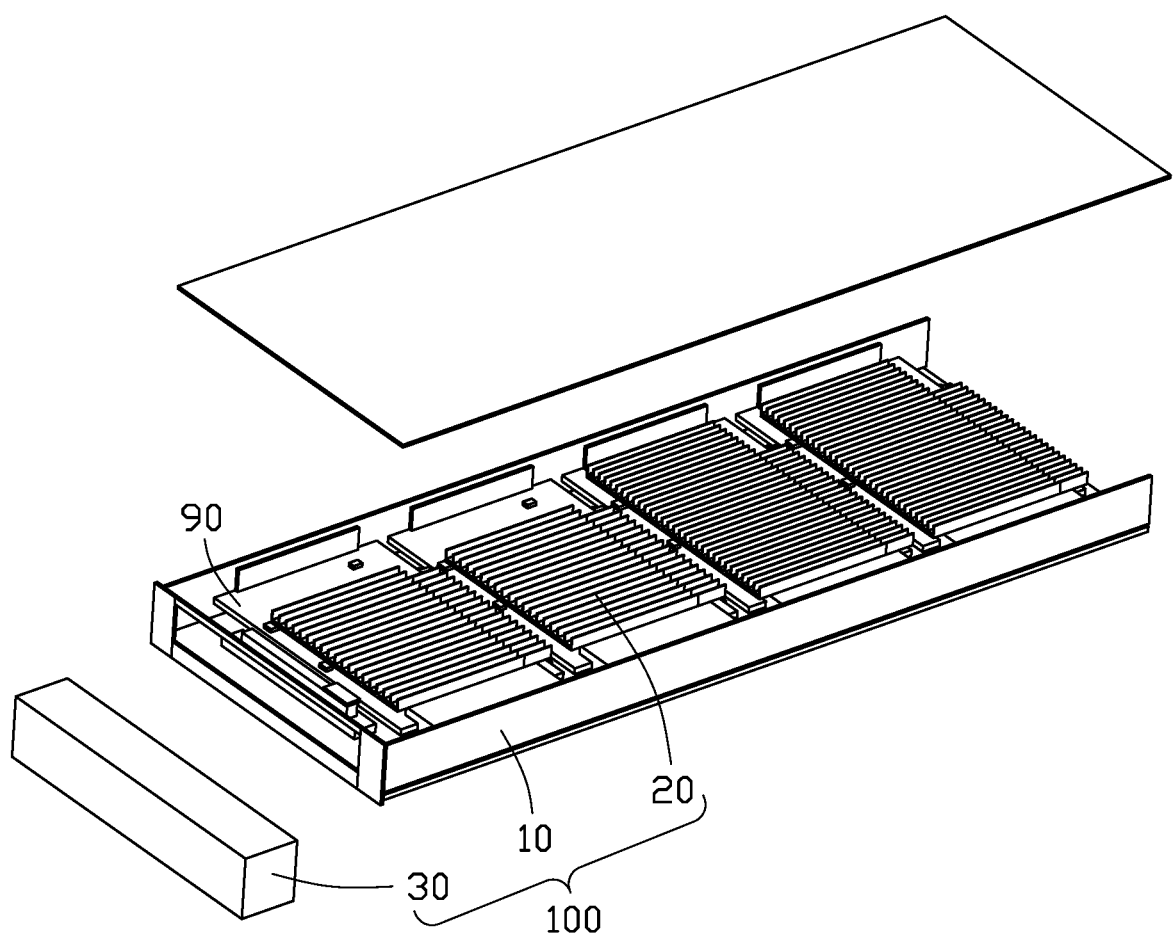
FIG. 5 is a schematic view of a server according to one embodiment.

Referring to FIGS. 2 and 5, the heat dissipation structures 20 are disposed in the air passage 10a. Referring to FIG. 3, each heat dissipation structure 20 includes a thermally conductive plate 21 and a plurality of fins 22. The thermally conductive plate 21 is in contact with and connected with the component 90. The plurality of fins 22 are arranged on the thermally conductive plate 21 at intervals along a second direction Y, and each fin 22 extends in length in the first direction X. A heat dissipation gap 23 is formed between two adjacent fins 22. The thermally conductive plate 21 is configured to transfer the heat generated by the component 90 to the fins 22. The fins 22 are configured to dissipate heat. When the cold air passes through the heat dissipation gap 23, the cold air exchanges heat with the fins 22 to dissipate heat from the fins 22, thereby dissipating heat from the component 90. The plurality of heat dissipation structures 20 includes a first heat dissipation structure 20a and a second heat dissipation structure 20b. The first heat dissipation structure 20a is adjacent to the air inlet 10b, and the second heat dissipation structure 20b is adjacent to the air outlet 10c. When the cold air is introduced into the air passage 10a via the air inlet 10b, the cold air flows through the first heat dissipation structure 20a and the second heat dissipation structure 20b in sequence, then flows out of the housing 10 via the air outlet 10c.

When a first distance between one heat dissipation structure 20 and the air inlet 10b is less than a second distance between the one heat dissipation structure 20 and the air outlet 10c, such heat dissipation structure 20 is determined to be adjacent to the air inlet 10b and is referred to as the first heat dissipation structure 20a. When the first distance between one heat dissipation structure 20 and the air inlet 10b is greater than the second distance between the one heat dissipation structure 20 and the air outlet 10c, such heat dissipation structure 20 is determined to be adjacent to the air outlet 10c and is referred to as the second heat dissipation structure 20b.

Figure 7:
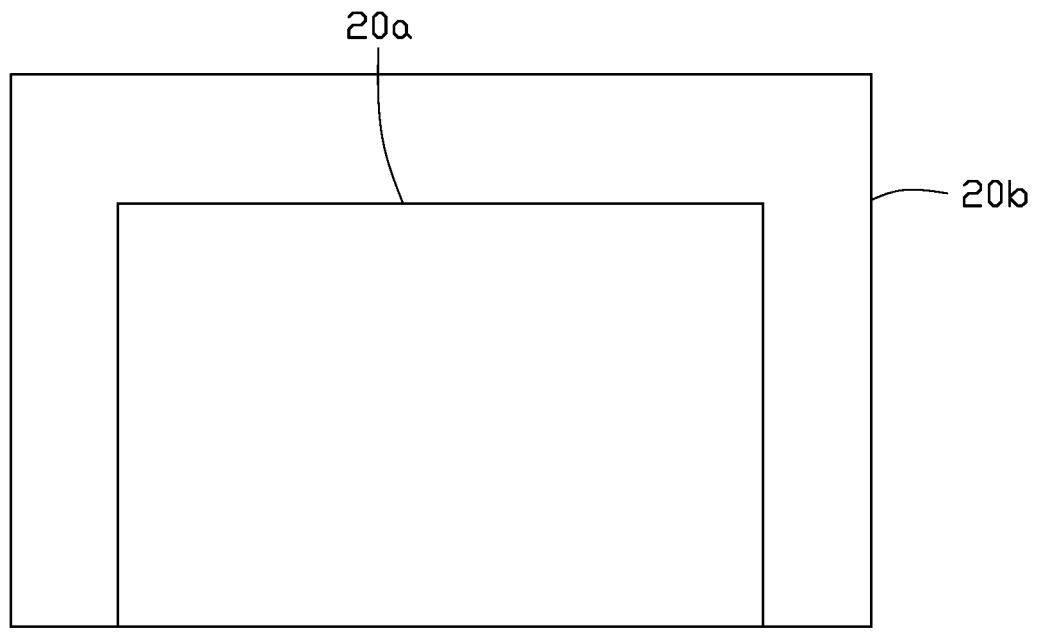
FIG. 7 is a schematic view showing a projection of a first heat dissipation structure on a second heat dissipation structure according to one embodiment.

Referring to FIGS. 2, 5, and 7, along the first direction X, a projection of the first heat dissipation structure 20a on the second heat dissipation structure 20b is within the second heat dissipation structure 20b, increasing a windward area of the second heat dissipation structure 20b. Along the second direction Y, a first spacing L1 of each heat dissipation gap 23 in the first heat dissipation structure 20a is greater than a second spacing L2 of each heat dissipation gap 23 in the second heat dissipation structure 20b, increasing air inlet amount of the second heat dissipation structure 20b. By doing so, the heat dissipation effect of the second heat dissipation structure 20b is improved while maintaining the heat dissipation effect of the first heat dissipation structure 20a, thereby improving the overall heat dissipation effect of the whole heat dissipation device 100.

In some embodiments, the first direction X is vertical to the second direction Y.

In some embodiments, the plurality of fins 22 are arranged on the thermally conductive plate 21 at equal intervals along the second direction Y.

In some embodiments, a ratio of an area of the projection of the first heat dissipation structure 20a on the second heat dissipation structure 20b to an area of the second heat dissipation structure 20b can be 10%, 20%, 30%, 40%, 50%, 60%, 70%, 80%, 90%, 100%, etc.

In some embodiments, a ratio of the second spacing L2 of the second heat dissipation structure 20b to the first spacing L1 of the first heat dissipation structure 20a can be 10%, 20%, 30%, 40%, 50%, 60%, 70%, 80%, 90%, 100%, etc.

Figure 8:
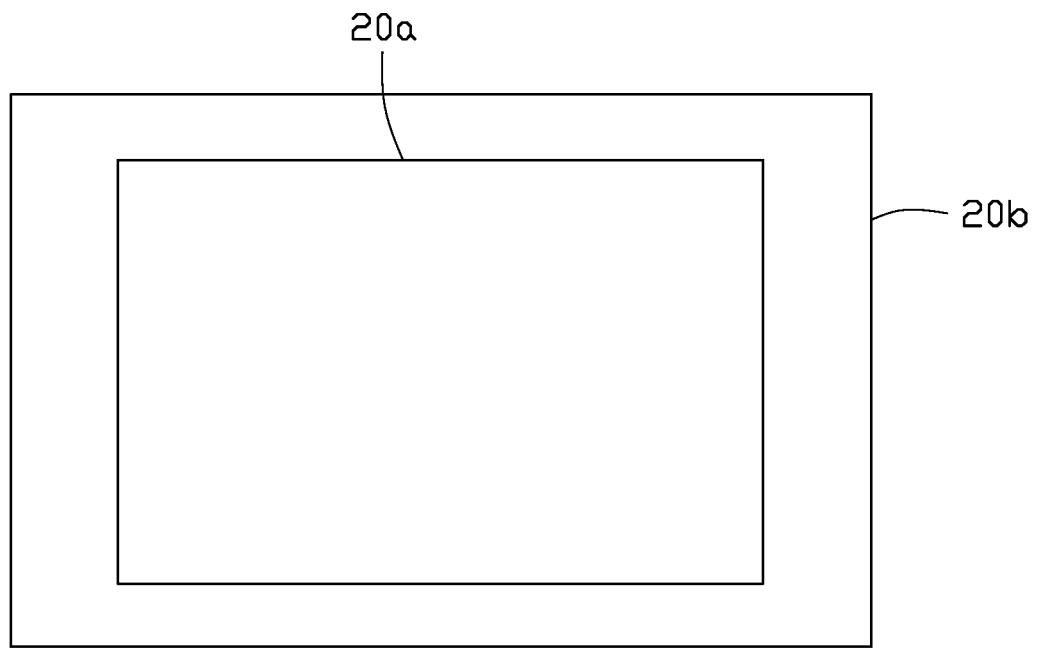
FIG. 8 is a schematic view showing a projection of a first second dissipation structure on an air inlet according to one embodiment.
Figure 9:
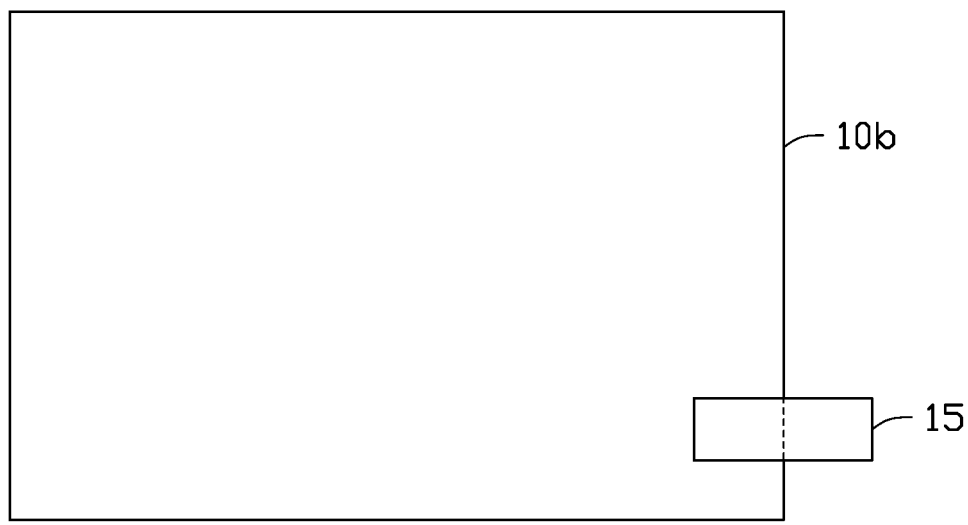
FIG. 9 is a schematic view showing a projection of a thermally conductive gap on an air inlet according to one embodiment.
Figure 10:
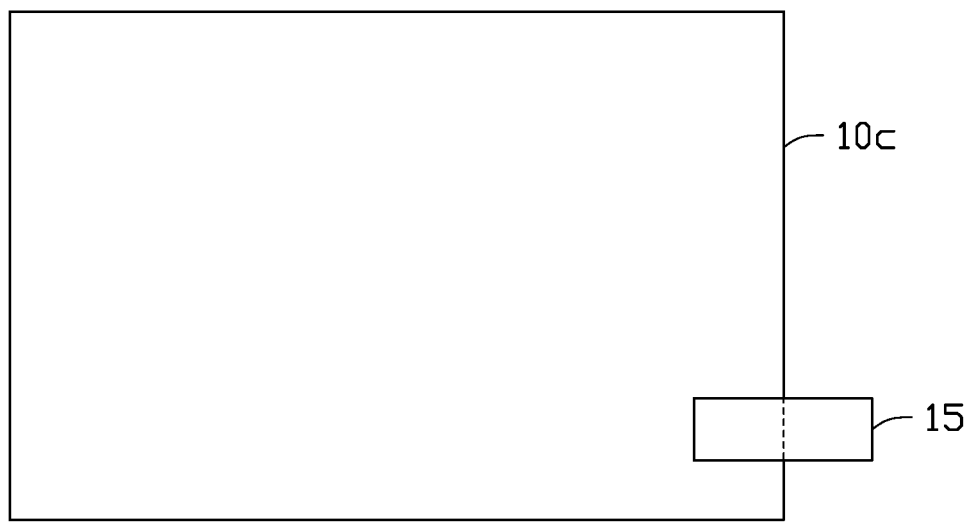
FIG. 10 is a schematic view showing a projection of a thermally conductive gap on an air outlet according to one embodiment.

Referring to FIGS. 2, 5, and 8, in some embodiments, along the first direction X, a projection of the second heat dissipation structure 20b on the air inlet 10b is within the air inlet 10b, further increasing the air inlet amount of the first heat dissipation structure 20a and the second heat dissipation structure 20b, improving the heat dissipation effect of the first heat dissipation structure 20a and the second heat dissipation structure 20b.

Referring to FIGS. 1 and 2, in some embodiments, the housing 10 includes a top plate 11, a bottom plate 12, and a side plate 13. The top plate 11 and the bottom plate 12 are spaced in a third direction Z, and the side plate 13 is connected between the top plate 11 and the bottom plate 12. The air passage 10a, the air inlet 10b, and the air outlet 10c are formed between the top plate 11 and the bottom plate 12.

A side of the thermally conductive plate 21 facing the bottom plate 12 is in contact with and connected with the component 90. The fins 22 are disposed on a side of the thermally conductive plate 21 facing the top plate 11 and extend towards the top plate 11 along the third direction Z, thereby increasing area of contact between cold air and the fins 22, further improving the heat dissipation effect of the heat dissipation structures 20.

In some embodiments, the third direction Z, the first direction X, and the second direction Y are at a right angle to each other.

In some embodiments, the heat dissipation structure further includes a thermally conductive layer (not shown). The thermally conductive layer is disposed between the component 90 and the thermally conductive plate 21, improving the efficiency of the heat transfer between the component 90 and the thermally conductive plate 21. Alternatively, the thermally conductive layer is a layer of thermally conductive silicone grease.

Referring to FIGS. 2 and 3, in some embodiments, the thermally conductive plate 21 of the first heat dissipation structure 20a is flush with the thermally conductive plate 21 of the second heat dissipation structure 20b in the third direction Z, reducing the windward areas of the plurality of thermally conductive plates 21, and facilitating the flow of cold air into the heat dissipation gap 23. In the third direction Z, a first height H1 of each fin 22 of the first heat dissipation structure 20a is less than or equal to a second height H2 of each fin 22 of the second heat dissipation structure 20b, so that the projection of the first heat dissipation structure 20a on the second heat dissipation structure 20b is within the second heat dissipation structure 20b.

Alternatively, a ratio of the first height H1 to the second height H2 can be 10%, 20%, 30%, 40%, 50%, 60%, 70%, 80%, 90%, 100%, etc.

In some embodiments, in one heat dissipation structure 20, the fins 22 are arranged along the second direction Y. The thermally conductive plate 21 of the first heat dissipation structure 20a is flush with the thermally conductive plate 21 of the second heat dissipation structure 20b in the third direction Z, and a first width W1 of the whole first heat dissipation structure 20a in the second direction Y is less than or equal to a second width of the whole second heat dissipation structure 20b in the second direction Y, so that the projection of the first heat dissipation structure 20a on the second heat dissipation structure 20b is within the second heat dissipation structure 20b.

It can be understood that the first width W1 is the maximum width of the whole first heat dissipation structure 20a, and the second width W2 is the maximum width of the whole second heat dissipation structure 20b.

Alternatively, a ratio of the first width W1 to the second width W2 can be 10%, 20%, 30%, 40%, 50%, 60%, 70%, 80%, 90%, 100%, etc.

In some embodiments, the thermally conductive plate 21 of the first heat dissipation structure 20a is flush with the thermally conductive plate 21 of the second heat dissipation structure 20b in the third direction Z, the first height H1 is less than the second height H2, and the first width W1 is less than the second width W2.

In some embodiments, the thermally conductive plate 21 of the first heat dissipation structure 20a is flush with the thermally conductive plate 21 of the second heat dissipation structure 20b in the third direction Z, the first height H1 is equal to the second height H2, and the first width W1 is less than the second width W2.

In some embodiments, the thermally conductive plate 21 of the first heat dissipation structure 20a is flush with the thermally conductive plate 21 of the second heat dissipation structure 20b in the third direction Z, the first width W1 is equal to the second width W2, and the first height H1 is less than the second height H2.

Figure 4:
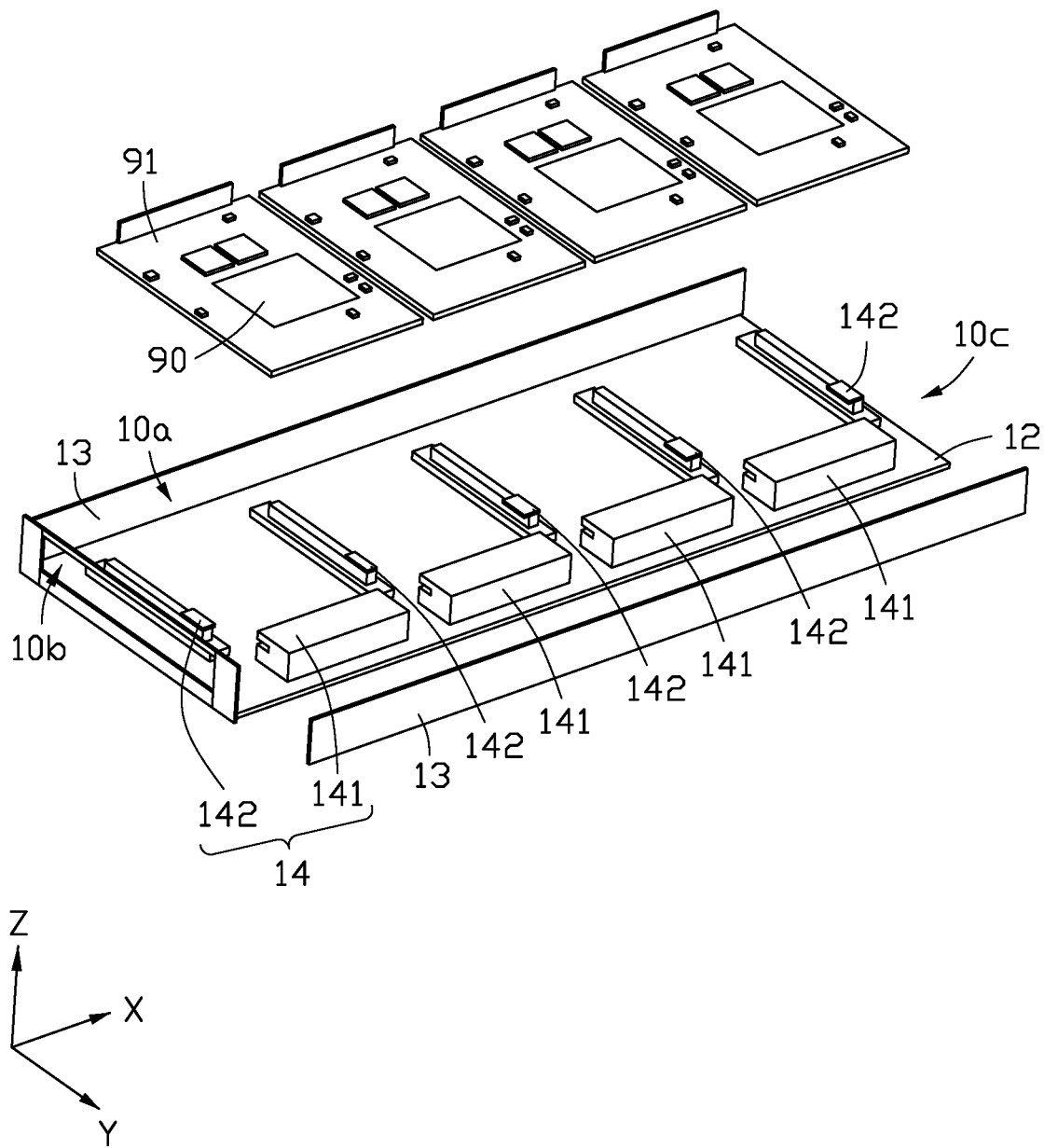
FIG. 4 is another exploded view of the heat dissipation device of FIG. 1.

Referring to FIGS. 2 and 4, in some embodiments, the housing 10 further includes a supporting member 14. The supporting member 14 is connected with the bottom plate 12. The supporting member 14 is configured to connect with a circuit board 91 supporting the component 90, and a thermally conductive gap 15 (shown in FIG. 1) is formed between the circuit board 91 and the bottom plate 12. When the cold air is introduced into the air passage 10a via the air inlet 10b, a part of the cold air flows along heat dissipation gaps 23 to dissipate heat from the heat dissipation structures 20 and the component 90, and a part of the cold air flows along the thermally conductive gap 15 to dissipate heat from the circuit board 91 and the component 90. The thermally conductive gap 15 and the heat dissipation gaps 23 are arranged to improve the overall heat dissipation effect of the whole heat dissipation device 100.

Referring to FIGS. 1, 5, 9, and 10, in some embodiments, along the first direction X, a projection of the supporting member 14 on the air inlet 10b is at least partially within the air inlet 10b, and a projection of the supporting member 14 on the air outlet 10c is at least partially within the air outlet 10c, so that a projection of the thermally conductive gap 15 on the air inlet 10b is at least partially within the air inlet 10b and a projection of the thermally conductive gap 15 on the air outlet 10c is at least partially within the air outlet 10c. The thermally conductive gap 15 penetrates in the first direction X and the cold air can pass through the thermally conductive gap 15 along the first direction X.

In some embodiments, the supporting member 14 includes a plurality of first supporting portions 141 and a plurality of second supporting portions 142. The plurality of first supporting portions 141 are connected with the bottom plate 12 and arranged at intervals along the first direction X. Each first supporting portion 141 is configured to support and connect with a side of the circuit board 91 in the second direction Y. The plurality of second supporting portions 142 are connected with the bottom plate 12 and arranged at intervals along the first direction X. Two adjacent second supporting portions 142 are configured to support and connect two sides of the circuit board 91 in the first direction X. Specifically, two sides of the circuit board 91 in the first direction resist against two adjacent second supporting portions 142, and one side of the circuit board 91 in the second direction Y resists against one first supporting portion 141. The first supporting portion 141 and the second supporting portion 142 cooperate to support the circuit board 91 in several directions, improving stability of connection between the circuit board 91 and the supporting member 14.

Figure 6A:
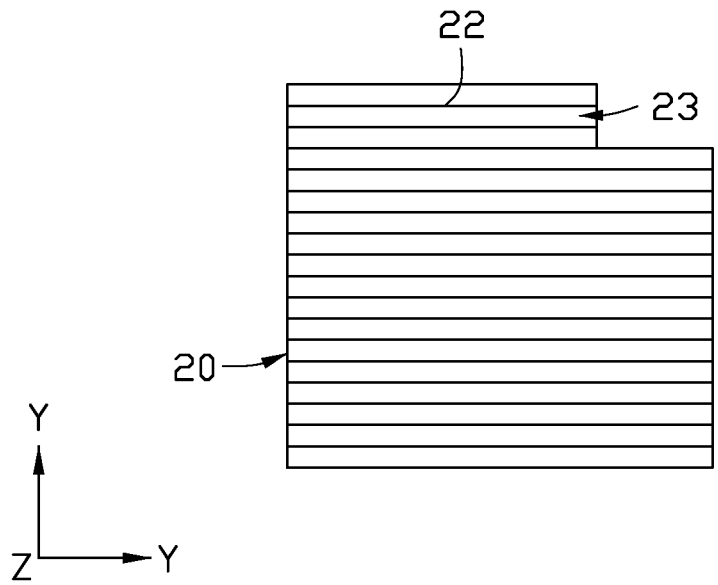
FIG. 6A is a top view of a heat dissipation structure of a heat dissipation device according to one embodiment.

Referring to FIG. 6A, in some embodiments, each fin 22 extends in a straight line in the first direction X.

Figure 6B:
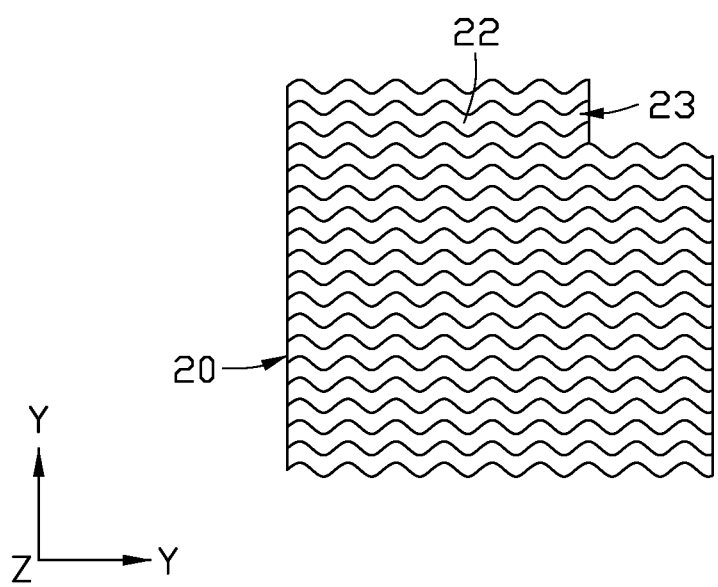
FIG. 6B is a top view of a heat dissipation structure of a heat dissipation device according to another embodiment.

Referring to FIG. 6B, in some embodiments, each fin 22 extends in a curve in the first direction X, to bring cold air in a turbulent flow into the heat dissipation gaps 23, improving efficiency of heat exchange, thus improving the heat dissipation effect of the heat dissipation structures 20. For example, the fin 22 can extend in a wavy line in the first direction. In other embodiment, a part of the fins 22 extend in a curve in the first direction X.

In some embodiments, the first direction X extends in an arc, and at least a part of the fins 22 bends and extends along the first direction X.

In some embodiments, the heat dissipation device 10 further includes dust screens (not shown in figures). The dust screens are connected with the housing 10 and cover the air inlet 10b and the air outlet 10c, to prevent dust and other impurities from entering into the air passage 10a.

Referring to FIG. 5, in some embodiments, the heat dissipation device 100 further includes an air blower 30. The air blower 30 faces the air inlet 10b and is configured to blow cold air into the air inlet 10b.

Alternatively, the air blower 30 may be a fan.

Referring to FIGS. 2 and 5, a server 200 of an embodiment is illustrated. The server 200 includes a chip 90a and the heat dissipation device 100. The chip 90a is accommodated in the air passage 10a, and the thermally conductive plate 21 is in contact with and connected with the chip 90a.

In some embodiments, there is one chip 90a, and the chip 90a is disposed in the air passage 10a and extends in length in the first direction X. The thermally conductive plate 21 of the first heat dissipation structure 20a is in contact with and connected with an area of the chip 90a adjacent to the air inlet 10b, and the thermally conductive plate 21 of the second heat dissipation structure 20b is in contact with and connected with an area of the chip 90a adjacent to the air outlet 10c.

In some embodiments, there are a plurality of chips 90a. The chips 90a are sequentially arranged in the air passage 10a along the first direction X. The thermally conductive plate 21 of the first heat dissipation structure 20a is in contact with and connected with a part of the chips 90a adjacent to the air inlet 10b, and the thermally conductive plate 21 of the second heat dissipation structure 20b is in contact with and connected with a part of the chips 90a adjacent to the air outlet 10c.

In the heat dissipation device 100 and the server 200, the projection of the first heat dissipation structure 20a on the second heat dissipation structure 20b along the first direction X is within the second heat dissipation structure 20b, increasing the windward area of the second heat dissipation structure 20b. Along the second direction Y, the first spacing L1 of each heat dissipation gap 23 in the first heat dissipation structure 20a is greater than the second spacing L2 of each heat dissipation gap 23 in the second heat dissipation structure 20b, increasing the air inlet amount of the second heat dissipation structure 20b. The heat dissipation effect of the second heat dissipation structure 20b is improved while maintaining the heat dissipation effect of the first heat dissipation structure 20a, thereby improving the overall heat dissipation effect of the whole heat dissipation device 100.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A heat dissipation device, comprising:
a housing defining an air passage extending along a first direction, an air inlet, and an air outlet, the air inlet and the air outlet being disposed on both ends of the air passage; and
a plurality of heat dissipation structures disposed in the air passage;
wherein the plurality of heat dissipation structures comprises a first heat dissipation structure adjacent to the air inlet and a second dissipation structure adjacent to the air outlet, a projection of the first heat dissipation structure on the second heat dissipation structure along the first direction is within the second heat dissipation structure;
each of the first heat dissipation structure and the second heat dissipation structure comprises a thermally conductive plate and a plurality of fins arranged on the thermally conductive plate at intervals along a second direction, the second direction being vertical to the first direction, each of the plurality of fins extends along the first direction, a heat dissipation gap is formed between two adjacent fins;
along the second direction, a first spacing of each heat dissipation gap in the first heat dissipation structure is greater than a second spacing of each heat dissipation gap in the second heat dissipation structure.

2. The heat dissipation device of claim 1, wherein along the first direction, a projection of the second heat dissipation structure on the air inlet is within the air inlet.

3. The heat dissipation device of claim 1, wherein the housing comprises a top plate, a bottom plate, and a side plate, the top plate and the bottom plate are spaced in a third direction, the third direction being vertical to each of the first direction and the second direction, the side plate is connected between the top plate and the bottom plate to form the air passage, the air inlet, and the air outlet, the plurality of fins are arranged on a side of the thermally conductive plate facing the top plate.

4. The heat dissipation device of claim 3, wherein in the third direction, the thermally conductive plate of the first heat dissipation structure is flush with the thermally conductive plate of the second heat dissipation structure, a first height of each fin of the first heat dissipation structure is less than or equal to a second height of each fin of the second heat dissipation structure.

5. The heat dissipation device of claim 3, wherein the thermally conductive plate of the first heat dissipation structure is flush with the thermally conductive plate of the second heat dissipation structure in the third direction, a first width of the first dissipation structure in the second direction is less than or equal to a second width of the second dissipation structure in the second direction.

6. The heat dissipation device of claim 3, wherein the housing further comprises a supporting member connected with the bottom plate, the supporting member supports a circuit board, a thermally conductive gap is formed between the circuit board and the bottom plate.

7. The heat dissipation device of claim 6, wherein along the first direction, a projection of the thermally conductive gap on the air inlet is at least partially within the air inlet, a projection of the thermally conductive gap on the air outlet is at least partially within the air outlet.

8. The heat dissipation device of claim 1, wherein each of the plurality of fins extends in a straight line in the first direction.

9. The heat dissipation device of claim 1, wherein each of the plurality of fins extends in a curve in the first direction.

10. The heat dissipation device of claim 1, further comprising an air blower for blowing cold air into the air inlet.

11. A server comprising:
   a chip; and
   a heat dissipation device, comprising:
      a housing defining an air passage extending along a first direction, an air inlet, and an air outlet, the air inlet and the air outlet being disposed on both ends of the air passage; and
      a plurality of heat dissipation structures disposed in the air passage;
   wherein the plurality of heat dissipation structures comprises a first heat dissipation structure adjacent to the air inlet and a second dissipation structure adjacent to the air outlet, a projection of the first heat dissipation structure on the second heat dissipation structure along the first direction is within the second heat dissipation structure;
   each of the first heat dissipation structure and the second heat dissipation structure comprises a thermally conductive plate and a plurality of fins arranged on the thermally conductive plate at intervals along a second direction, the second direction being vertical to the first direction, the thermally conductive plate supports the chip, each of the plurality of fins extends in length in the first direction, a heat dissipation gap is formed between two adjacent fins;
   along the second direction, a first spacing of each heat dissipation gap in the first heat dissipation structure is greater than a second spacing of each heat dissipation gap in the second heat dissipation structure.

12. The server of claim 11, wherein along the first direction, a projection of the second heat dissipation structure on the air inlet is within the air inlet.

13. The server of claim 11, wherein the housing comprises a top plate, a bottom plate, and a side plate, the top plate and the bottom plate are spaced in a third direction, the third direction being vertical to each of the first direction and the second direction, the side plate is connected between the top plate and the bottom plate to form the air passage, the air inlet, and the air outlet, the plurality of fins are arranged on a side of the thermally conductive plate facing the top plate.

14. The server of claim 13, wherein in the third direction, the thermally conductive plate of the first heat dissipation structure is flush with the thermally conductive plate of the second heat dissipation structure, a first height of each fin of the first heat dissipation structure is less than or equal to a second height of each fin of the second heat dissipation structure.

15. The server of claim 13, wherein the thermally conductive plate of the first heat dissipation structure is flush with the thermally conductive plate of the second heat dissipation structure in the third direction, a first width of the first dissipation structure in the second direction is less than or equal to a second width of the second dissipation structure in the second direction.

16. The server of claim 13, wherein the housing further comprises a supporting member connected with the bottom plate, the supporting member supports a circuit board, a thermally conductive gap is formed between the circuit board and the bottom plate.

17. The server of claim 16, wherein along the first direction, a projection of the thermally conductive gap on the air inlet is at least partially within the air inlet, a projection of the thermally conductive gap on the air outlet is at least partially within the air outlet.

18. The server of claim 11, wherein each of the plurality of fins extends in a straight line in the first direction.

19. The server of claim 11, wherein each of the plurality of fins extends in a curve in the first direction.

20. The server of claim 11, wherein the heat dissipation device further comprises an air blower for blowing cold air into the air inlet.

* * * * *